(12) United States Patent
Fukuda

(10) Patent No.: US 10,651,038 B2
(45) Date of Patent: May 12, 2020

(54) SEMICONDUCTOR DEVICE

(71) Applicant: SHINDENGEN ELECTRIC MANUFACTURING CO., LTD., Tokyo (JP)

(72) Inventor: Yusuke Fukuda, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/745,568

(22) PCT Filed: Sep. 21, 2016

(86) PCT No.: PCT/JP2016/077826
§ 371 (c)(1),
(2) Date: Jan. 17, 2018

(87) PCT Pub. No.: WO2018/055693
PCT Pub. Date: Mar. 29, 2018

(65) Prior Publication Data
US 2019/0006181 A1   Jan. 3, 2019

(51) Int. Cl.
*H01L 29/15* (2006.01)
*H01L 21/28* (2006.01)
(Continued)

(52) U.S. Cl.
CPC .............. *H01L 21/28* (2013.01); *H01L 24/04* (2013.01); *H01L 24/05* (2013.01);
(Continued)

(58) Field of Classification Search
CPC ...... H01L 23/522; H01L 21/768; H01L 21/28
See application file for complete search history.

(56) References Cited

U.S. PATENT DOCUMENTS

2002/0068488 A1* 6/2002 Tuller ............... H01L 21/048
439/775
2005/0000729 A1* 1/2005 Iljima ............... H01L 23/49833
174/260
(Continued)

FOREIGN PATENT DOCUMENTS

JP          60-54462 A      3/1985
JP       2010-272711     * 12/2010
(Continued)

OTHER PUBLICATIONS

International Search Report for PCT/JP2016/077826, dated Nov. 22, 2016, 2 pages.
(Continued)

*Primary Examiner* — Didarul A Mazumder
*Assistant Examiner* — Wasiul Haider
(74) *Attorney, Agent, or Firm* — Nixon & Vanderhye P.C.

(57) ABSTRACT

A semiconductor device includes: a semiconductor layer of silicon carbide including a plurality of layers disposed on a main surface side; an electrode layer that is one of the plurality of layers, wherein the electrode layer has an electrode connecting surface to which a conductive connecting member is connected, and the electrode layer is composed mainly of silver; and a first metal layer that is a layer, different from the electrode layer, among the plurality of layers, wherein the first metal layer has a first bonding surface bonded onto the electrode layer such that the electrode connecting surface is exposed to an outside, and a second bonding surface electrically connected to the semiconductor layer, and the first metal layer is composed mainly of titanium carbide.

8 Claims, 7 Drawing Sheets

(51) Int. Cl.
*H01L 23/00* (2006.01)
*H01L 29/45* (2006.01)
*H01L 21/04* (2006.01)
*H01L 29/872* (2006.01)
*H01L 29/47* (2006.01)

(52) U.S. Cl.
CPC ...... *H01L 21/0485* (2013.01); *H01L 21/0495* (2013.01); *H01L 24/45* (2013.01); *H01L 24/48* (2013.01); *H01L 29/45* (2013.01); *H01L 29/47* (2013.01); *H01L 29/872* (2013.01); *H01L 2224/04042* (2013.01); *H01L 2224/05017* (2013.01); *H01L 2224/05018* (2013.01); *H01L 2224/05078* (2013.01); *H01L 2224/05166* (2013.01); *H01L 2224/05186* (2013.01); *H01L 2224/05547* (2013.01); *H01L 2224/05551* (2013.01); *H01L 2224/05555* (2013.01); *H01L 2224/05557* (2013.01); *H01L 2224/05559* (2013.01); *H01L 2224/05564* (2013.01); *H01L 2224/05576* (2013.01); *H01L 2224/05578* (2013.01); *H01L 2224/05583* (2013.01); *H01L 2224/05639* (2013.01); *H01L 2224/05686* (2013.01); *H01L 2224/45147* (2013.01); *H01L 2224/48* (2013.01); *H01L 2224/48227* (2013.01); *H01L 2224/48247* (2013.01); *H01L 2224/48463* (2013.01); *H01L 2924/01029* (2013.01); *H01L 2924/10272* (2013.01); *H01L 2924/35121* (2013.01); *H01L 2924/3651* (2013.01)

(56) References Cited

U.S. PATENT DOCUMENTS

| | | | | |
|---|---|---|---|---|
| 2012/0217638 | A1* | 8/2012 | Tanaka | B81C 3/001 257/741 |
| 2015/0049449 | A1* | 2/2015 | Shibano | G02F 1/13458 361/772 |
| 2016/0126347 | A1* | 5/2016 | Wada | H01L 21/3065 257/77 |
| 2016/0240665 | A1* | 8/2016 | Chen | H01L 29/0847 |

FOREIGN PATENT DOCUMENTS

| | | | |
|---|---|---|---|
| JP | 2013-125922 | | 6/2013 |
| JP | 2014-082367 | | 5/2014 |
| JP | 2014-236043 | | 12/2014 |
| JP | 2016-11570 | * | 6/2016 |
| JP | 2016-115700 | | 6/2016 |

OTHER PUBLICATIONS

Written Opinion of the ISA for PCT/JP2016/077826, dated Nov. 22, 2016, 4 pages.
Extended European Search Report dated Mar. 9, 2020 in European Application No. 16909064.4, 9 pages.

* cited by examiner

SEMICONDUCTOR DEVICE

This application is the U.S. national phase of International Application No. PCT/JP2016/077826 filed 21 Sep. 2016, which designated the U.S., the entire contents of which is hereby incorporated by reference.

TECHNICAL FIELD

The present invention relates to a semiconductor device.

BACKGROUND ART

Recently, a semiconductor device in which silicon carbide (SiC) is used as a semiconductor layer is widely used because it has a wide band gap and can operate at high temperature. In a conventional semiconductor device using silicon carbide, a metal layer is bonded over a semiconductor layer of silicon carbide, and an electrode layer is bonded over the metal layer. The metal layer is composed of, for example, titanium (Ti) as a main component, and the electrode layer is composed of, for example, aluminum (Al) as a main component.

Generally, a semiconductor device generates heat according to a flowing current. Additionally, in the case of the above-described conventional semiconductor device, since a melting point of aluminum of the electrode layer is the lowest among the respective layers, an allowable current that can flow from the electrode layer to the semiconductor layer is limited to a current value that is lower than the temperature at which the electrode layer composed of aluminum melts. Therefore, in the conventional semiconductor device, in order to increase such an allowable current, in place of aluminum, an electrode layer is composed of silver (Ag) having a melting point higher than that of aluminum (see, for example, Patent Document 1).

CITATION LIST

Patent Literature

[Patent Literature 1] Japanese Patent Application Laid-Open Publication No. 2013-125922

SUMMARY OF THE INVENTION

Problems to be Solved by the Invention

However, in the above-described conventional semiconductor device, if an electrode layer is composed of silver instead of aluminum, titanium is used for the metal layer bonded onto this electrode layer, so that an alloy of silver and titanium will be generated. The alloys of silver and titanium generally have low strength and are known as physically brittle alloys. In the conventional semiconductor device, the bonding strength between the electrode layer and the metal layer occasionally decreases due to generation of a physically brittle alloy of silver and titanium. Therefore, in the conventional semiconductor device, it has been difficult to increase the allowable current without lowering the bonding strength between the electrode layer and the metal layer.

The present invention has been made in view of the above problems and an object thereof is to provide a semiconductor device capable of increasing an allowable current without lowering a bonding strength between an electrode layer and a metal layer.

Means for Solving the Problems

In order to solve the above problem, a semiconductor device according to one aspect of the present invention includes: a semiconductor layer of silicon carbide including a plurality of layers disposed on a main surface side; an electrode layer that is one of the plurality of layers, wherein the electrode layer has an electrode connecting surface to which a conductive connecting member is connected, and the electrode layer is composed mainly of silver; and a first metal layer that is a layer, different from the electrode layer, among the plurality of layers, wherein the first metal layer has a first bonding surface bonded onto the electrode layer such that the electrode connecting surface is exposed to an outside, and a second bonding surface electrically connected to the semiconductor layer, and the first metal layer is composed mainly of titanium carbide.

Additionally, the semiconductor device according to one aspect of the present invention may further includes: a second metal layer between the first metal layer and the semiconductor layer, wherein the second metal layer is bonded onto the first metal layer by the second bonding surface, the second metal layer is disposed in contact with the semiconductor layer, and the second metal layer is composed mainly of titanium.

Further, in the semiconductor device according to one aspect of the present invention, the first metal layer may have the first bonding surface on the first main surface side and the second bonding surface on a second main surface side opposite to the first main surface.

Moreover, in the semiconductor device according to one aspect of the present invention, the first metal layer may be bonded onto the electrode layer so that the first bonding surface covers a surface, other than the electrode connecting surface, of the electrode layer.

Additionally, in the semiconductor device according to one aspect of the present invention, in the first metal layer, a bonding area of the first bonding surface may be larger than an area of the electrode connecting surface.

Further, in the semiconductor device according to one aspect of the present invention, a surface, opposing the electrode connecting surface, of the electrode layer may be disposed inside the main surface of the semiconductor layer on the side where the electrode layer is disposed, in a thickness direction of the semiconductor layer.

Moreover, in the semiconductor device according to one aspect of the present invention, the connecting member composed mainly of copper may be connected to the electrode connecting surface of the electrode layer.

Effects of the Invention

According to the present invention, the electrode layer having the electrode connecting surface to which the conductive connecting member is connected is composed mainly of silver. Additionally, the first metal layer has the first bonding surface bonded to the electrode layer so that the electrode connecting surface is exposed to the outside, and the second bonding surface electrically connected to the semiconductor layer, and is composed mainly of titanium carbide. Since the electrode layer is composed of silver having the higher electrical conductivity than aluminum composing the conventional electrode layer, heat is hardly generated by a current flowing from the electrode layer to the semiconductor layer. Further, since heat is hardly generated in this way, the melting points of silver of the electrode layer and titanium carbide of the first metal layer are higher than the melting point of aluminum composing the conventional electrode layer, the allowable current can be increased. Additionally, since a physically brittle alloy such as an alloy of silver and titanium is not generated between the first metal layer of titanium carbide and silver of the electrode layer, the bonding strength between the electrode layer and the metal layer is not lowered by a physically brittle alloy. Therefore, the semiconductor device according to the present invention can increase the allowable current without lowering the bonding strength between the electrode layer and the metal layer.

MODE FOR CARRYING OUT THE INVENTION

Hereinafter, semiconductor devices according to embodiments of the present invention will be described with reference to the drawings.

First Embodiment

Figure 1:
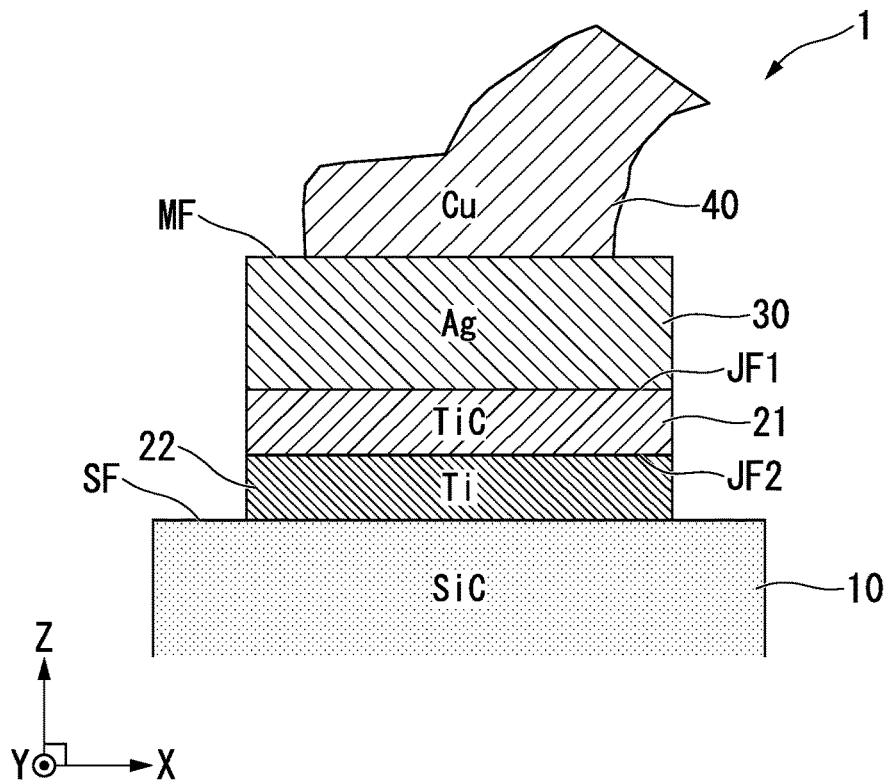
FIG. 1 is a sectional configuration diagram showing an example of a semiconductor device according to a first embodiment.

As shown in FIG. 1, a semiconductor device 1 according to the first embodiment includes a semiconductor layer 10, a first metal layer 21, a second metal layer 22, an electrode layer 30, and a connecting member 40. The semiconductor device 1 is a semiconductor device using a semiconductor substrate of silicon carbide (hereinafter occasionally referred to as SiC), such as a thyristor, a transistor, a diode, or the like.

Here, in FIG. 1, a horizontal direction on the paper surface is defined as an X-axis direction, a direction perpendicular to the paper surface is defined as a Y-axis direction, and a vertical direction on the paper surface (thickness direction of the semiconductor layer 10) is defined as a Z-axis direction.

The semiconductor layer 10 is part of the semiconductor substrate and is composed of SiC. In the semiconductor layer 10, a plurality of layers (e.g., a plurality of metal layers) are arranged on a main surface SF side.

Here, the above-described plurality of layers includes a first metal layer 21, a second metal layer 22, and an electrode layer 30.

The electrode layer 30 is one of the above-described plurality of layers and has an electrode connecting surface MF to which the conductive connecting member 40 is connected. The electrode layer 30 is composed of, for example, silver (hereinafter occasionally referred to as Ag) as a main component. The electrode layer 30 is formed outside the first metal layer 21 that will be described later. Here, the outside of the first metal layer 21 refers to the side far from the semiconductor layer 10 in +(plus) direction of the thickness direction (Z-axis direction), that is, an upper side in the vertical direction on the paper surface of FIG. 1. The electrode layer 30 is disposed on the outermost side among the above-described plurality of layers. The connecting member 40 is connected to the electrode connecting surface MF of the electrode layer 30.

The first metal layer 21 is a layer, different from the electrode layer 30, among the above-described plurality of layers and is a metal layer disposed between the electrode layer 30 and the second metal layer 22 that will be described later. The first metal layer 21 is composed of, for example, titanium carbide (hereinafter occasionally referred to as TiC) as a main component. Additionally, the first metal layer 21 has a first bonding surface JF1 bonded onto the electrode layer 30 so that the electrode connecting surface MF is exposed to the outside and a second bonding surface JF2 electrically connected to the semiconductor layer 10.

Here, the first bonding surface JF1 is a bonding surface between the electrode layer 30 and the first metal layer 21, for example, a bonding surface formed so as to be parallel to the main surface SF and the electrode connecting surface MF of the semiconductor layer 10. Additionally, the second bonding surface JF2 is a bonding surface between the first metal layer 21 and the second metal layer 22, for example, a bonding surface formed so as to be parallel to the main surface SF and the electrode connecting surface MF of the semiconductor layer 10.

The first metal layer 21 has the first bonding surface JF1 on the outer side (first main surface side) and the second bonding surface JF2 on the inner side (second main surface side) that is a main surface opposite to the first main surface. Here, in the present embodiment, the first metal layer 21 is electrically connected to the semiconductor layer 10 via the second bonding surface JF2 and the second metal layer 22. Here, the "inner side" is the side close to the + direction of the Z-axis direction.

The second metal layer 22 is one of the above-described plurality of layers and is a metal layer formed on the main surface SF of the semiconductor layer 10. The second metal layer 22 is composed of, for example, titanium (hereinafter occasionally referred to as Ti) as a main component. The second metal layer 22 is a layer between the first metal layer 21 and the semiconductor layer 10, is bonded onto the first metal layer 21 by the second bonding surface JF2, and is disposed in contact with the semiconductor layer 10. Additionally, the second metal layer 22 is in ohmic contact or Schottky junction with the semiconductor layer 10.

The connecting member 40 is a conductive member that electrically connects the electrode layer 30 and the outside of the semiconductor device 1 (e.g., a mounting substrate or a lead frame of a package), and is composed of, for example, copper (hereinafter occasionally referred to as Cu) as a main component. The connecting member 40 is, for example, copper wiring (copper wire) or the like.

As described above, in the semiconductor device 1 according to the present embodiment, the second metal layer 22 of Ti, the first metal layer 21 of TiC, and the electrode layer 30 of Ag are arranged in this order from the main surface SF of the semiconductor layer 10 of SiC toward the outside (far side in the + direction of the Z-axis direction). Additionally, the connecting member 40 of Cu is connected to the electrode connecting surface MF of the electrode layer 30 and is connected to the outside of the semiconductor device 1.

Further, the current flowing from the outside to the semiconductor device 1 flows to the semiconductor layer 10 of SiC via the connecting member 40 of Cu, the electrode layer 30 of Ag, the first metal layer 21 of TiC, and the second metal layer 22 of Ti.

As described above, the semiconductor device 1 according to the present embodiment includes the semiconductor layer 10, the electrode layer 30, and the first metal layer 21. The semiconductor layer 10 is composed of SiC (silicon carbide) and includes the plurality of layers arranged on the main surface SF side. The electrode layer 30 is one of the plurality of layers, has the electrode connecting surface MF to which the conductive connecting member 40 is connected, and is composed of Ag (silver) as a main component. The first metal layer 21 is a layer, different from the electrode layer 30, among the plurality of layers, has the first bonding surface JF1 bonded onto the electrode layer 30 so that the electrode connecting surface MF is exposed to the outside and the second bonding surface JF2 electrically connected to the semiconductor layer 10, and is composed of TiC (titanium carbide) as a main component.

Thus, in the semiconductor device 1 according to the present embodiment, since the electrode layer 30 is composed of Ag having a higher electrical conductivity than aluminum composing the conventional electrode layer, heat becomes hardly generated due to the current flowing from the electrode layer 30 to the semiconductor layer 10. Further, in the semiconductor device 1 according to the present embodiment, heat is hardly generated as described above, and since the melting point (approximately 961.8° C.) of Ag of the electrode layer 30 and the melting point (approximately 3170° C.) of TiC of the first metal layer 21 are higher than the melting point (about 660.3° C.) of aluminum composing the conventional electrode layer 30, the current allowed to flow from the electrode layer 30 to the semiconductor layer 10 can be increased.

Moreover, since a physically brittle alloy such as an alloy of Ag and Ti is not formed between the first metal layer 21 of TiC and the electrode layer 30 of Ag. Therefore, in the semiconductor device 1 according to the present embodiment, the bonding strength between the electrode layer 30 and the metal layer (e.g., the first metal layer 21) is not lowered by a physically fragile alloy. In the semiconductor device 1 according to the present embodiment, it is possible to reduce an occurrence of manufacturing troubles such that the electrode layer 30 and the metal layer (e.g., the first metal layer 21) are peeled off due to, for example, a load (stress, stress) applied when the connecting member 40 is connected to the electrode layer 30.

Therefore, the semiconductor device 1 according to the present invention can increase the allowable current without lowering the bonding strength between the electrode layer 30 and the metal layer (the first metal layer 21).

Additionally, since the first metal layer 21 functions as a barrier metal for preventing, for example, Cu of the connecting member 40 and Ag of the electrode layer 30 from diffusing into the semiconductor layer 10, the semiconductor device 1 according to the present invention can suppress degradation of the performance due to the diffusion of Cu and Ag.

Further, the semiconductor device 1 according to the present embodiment includes the second metal layer 22 composed of Ti (titanium) as a main component, which is a layer between the first metal layer 21 and the semiconductor layer 10, is bonded onto the first metal layer 21 by the second bonding surface JF2, and is in contact with the semiconductor layer 10.

As a result, like the first metal layer 21, the second metal layer 22 of the semiconductor device 1 according to the present embodiment functions as a barrier metal, so that the semiconductor device 1 according to the present invention can further suppress the degradation of the performance due to the diffusion of Cu and Ag.

Moreover, in the present embodiment, the first metal layer 21 has the first bonding surface JF1 on the outer side (first main surface side) and the second bonding surface JF2 on the inner side (second main surface side) that is the main surface opposite to the first main surface.

Accordingly, since the first metal layer 21 of TiC is disposed between the electrode layer 30 and the semiconductor layer 10, the semiconductor device 1 according to the present invention can increase the allowable current without lowering the bonding strength between the electrode layer 30 and the metal layer (first metal layer 21).

Additionally, in the present embodiment, the electrode connecting surface MF of the electrode layer 30 is connected with the connecting member 40 composed of Cu (copper) as a main component.

Accordingly, since the melting point of Cu (approximately 1085° C.) is higher than the melting point of aluminum (approximately 660.3° C.), the current allowed to flow from the electrode layer 30 to the semiconductor layer 10 can be increased. Further, Cu and Ag of the electrode layer 30 have good compatibility (connectivity) so that such a physically brittle alloy as an alloy of Ag and Ti will not be generated. Therefore, in the semiconductor device 1 according to the present embodiment, the bonding strength between the electrode layer 30 and the connecting member 40 is not lowered by a physically brittle alloy.

Second Embodiment

Next, a semiconductor device 1a according to a second embodiment of the present invention will be described with reference to FIG. 2.

Figure 2:
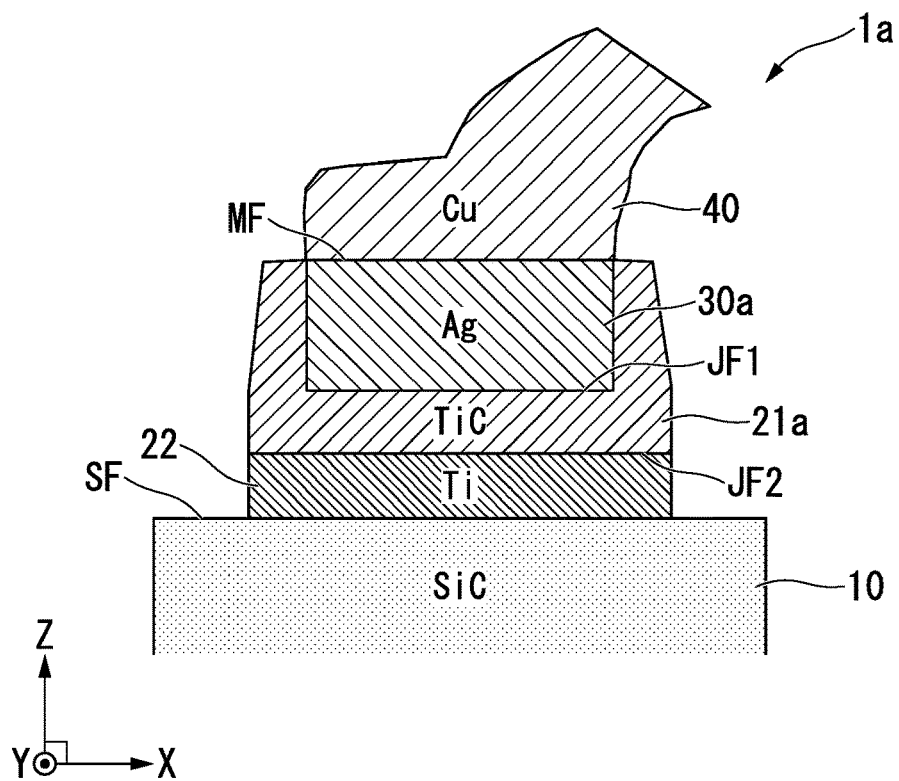
FIG. 2 is a sectional configuration diagram showing an example of a semiconductor device according to a second embodiment.

As shown in FIG. 2, the semiconductor device 1a according to the second embodiment includes the semiconductor layer 10, a first metal layer 21a, the second metal layer 22, an electrode layer 30a, and the connecting member 40. Here, in FIG. 2, the same components as those in FIG. 1 are denoted by the same reference numerals, and description thereof is omitted.

The present embodiment differs from the first embodiment in that the first metal layer 21a is disposed so as to cover surfaces, other than the electrode connecting surface MF, of the electrode layer 30a.

The electrode layer 30a is one of a plurality of layers and has the electrode connecting surface MF to which the conductive connecting member 40 is connected, and is composed of, for example, Ag as a main component. The electrode layer 30a is formed such that the surfaces excluding the electrode connecting surface MF are covered with the first metal layer 21a. In other words, the electrode layer 30a is buried in the first metal layer 21a so that only the electrode connecting surface MF is exposed, and the connecting member 40 is connected to the exposed electrode connecting surface MF.

The first metal layer 21a is a layer, different from the electrode layer 30a, among the plurality of layers, and is composed of, for example, TiC as a main component. The first metal layer 21a is formed so as to cover the electrode layer 30a. For example, in the first metal layer 21a, a first bonding surface JF1 is bonded onto the electrode layer 30a so as to cover the surfaces, other than the electrode connecting surface MF, of the electrode layer 30a.

Here, the first bonding surface JF1 includes a surface parallel to the main surface SF on the outer side (side far from the semiconductor layer 10) of the first metal layer 21a and side surfaces parallel to the thickness direction (Z-axis direction).

Additionally, the first metal layer 21a is electrically connected to the semiconductor layer 10 via the second bonding surface JF2 and the second metal layer 22.

As described above, the semiconductor device 1a according to the present embodiment includes the semiconductor layer 10, the electrode layer 30a, the first metal layer 21a, and the second metal layer 22.

As a result, the semiconductor device 1a according to the present invention achieves the same effects as those of the first embodiment, and can increase the allowable current without lowering the bonding strength between the electrode layer 30a and the metal layer (the first metal layer 21a).

Additionally, in the present embodiment, the first metal layer 21a is bonded onto the electrode layer 30a so that the first bonding surface JF1 covers the surfaces, other than the electrode connecting surface MF, of the electrode layer 30a.

As a result, since the electrode layer 30a is covered with the first metal layer 21a, the semiconductor device 1a according to the present embodiment can suppress corrosion of Ag of the electrode layer 30a, and can improve corrosion resistance.

Further, since the area of the first bonding surface JF1 is larger than that of the first embodiment, the semiconductor device 1a according to the present embodiment can further improve the bonding strength between the electrode layer 30a and the first metal layer 21a.

Third Embodiment

Next, a semiconductor device 1b according to a third embodiment of the present invention will be described with reference to FIG. 3.

Figure 3:
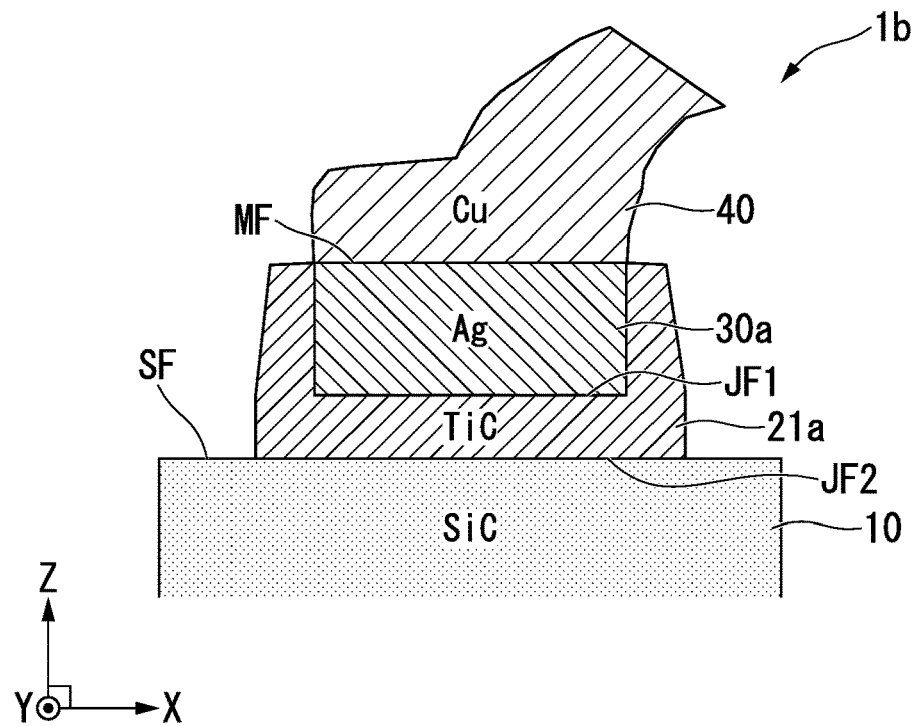
FIG. 3 is a sectional configuration diagram showing an example of a semiconductor device according to a third embodiment.

As shown in FIG. 3, the semiconductor device 1b according to the third embodiment includes the semiconductor layer 10, the first metal layer 21a, the electrode layer 30a, and the connecting member 40. Here, in FIG. 3, the same components as those in FIG. 2 are denoted by the same reference numerals, and description thereof is omitted.

The present embodiment differs from the second embodiment in that the semiconductor device 1b does not include the second metal layer 22.

In the first metal layer 21a, the second bonding surface JF2 is disposed in contact with the semiconductor layer 10. In other words, the first metal layer 21a is electrically connected to the semiconductor layer 10 via the second bonding surface JF2. Additionally, the first metal layer 21a is in ohmic contact or Schottky junction with the semiconductor layer 10, in place of the second metal layer 22 of the second embodiment.

Here, since other configurations of the present embodiment are similar to those of the second embodiment, description thereof will be omitted here.

As described above, the semiconductor device 1b according to the present embodiment includes the semiconductor layer 10, the electrode layer 30a, and the first metal layer 21a.

As a result, the semiconductor device 1b according to the present invention achieves the same effects as those of the first embodiment and can increase the allowable current without lowering the bonding strength between the electrode layer 30a and the metal layer (the first metal layer 21a). Additionally, in the semiconductor device 1b according to the present invention, since the electrode layer 30a is covered with the first metal layer 21a, as in the second embodiment, corrosion of Ag of the electrode layer 30a can be suppressed, and corrosion resistance can be improved.

Further, since there is no need to form the second metal layer 22, the semiconductor device 1b according to the present invention can simplify the manufacturing process and the configuration of the metal layer.

Fourth Embodiment

Next, a semiconductor device 1c according to a fourth embodiment of the present invention will be described with reference to FIG. 4.

Figure 4:
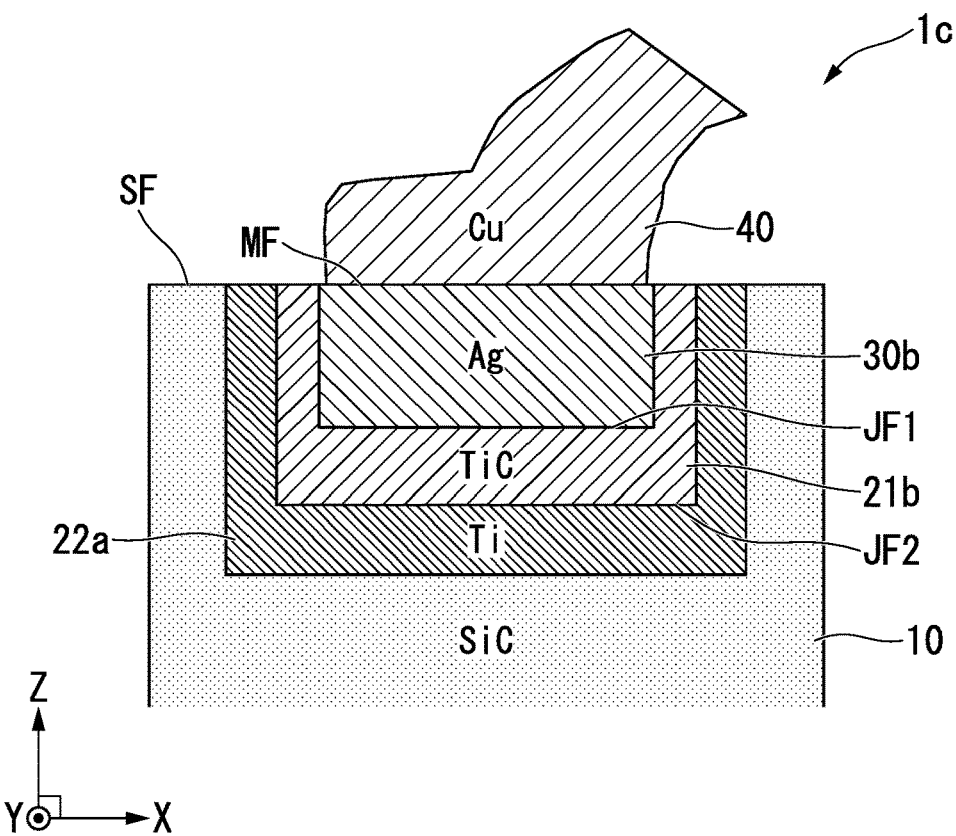
FIG. 4 is a sectional configuration diagram showing an example of a semiconductor device according to a fourth embodiment.

As shown in FIG. 4, the semiconductor device 1c according to the fourth embodiment includes the semiconductor layer 10, a first metal layer 21b, a second metal layer 22a, an electrode layer 30b, and the connecting member 40. Here, in FIG. 4, the same components as those in FIG. 2 are denoted by the same reference numerals, and description thereof is omitted.

The present embodiment differs from the second embodiment in that the plurality of metal layers (the first metal layer 21b, the second metal layer 22a, and the electrode layer 30b) are arranged so as to be buried in the semiconductor layer 10.

The second metal layer 22a is formed so as to be buried in the semiconductor layer 10, and is composed of, for example, Ti as a main component. Additionally, the second metal layer 22a is disposed inside the main surface SF of the semiconductor layer 10 on the side where the electrode layer 30b is disposed, in the thickness direction of the semiconductor layer 10. In other words, the second metal layer 22a is formed so as to have a surface aligned with the main surface SF of the semiconductor layer 10 on the side where the electrode layer 30b is disposed, in the thickness direction of the semiconductor layer 10. Further, the second metal layer 22a is disposed so as to cover surfaces, other than the surface contacting the main surface SF, of the semiconductor layer 10, along a recessed portion formed in the semiconductor layer 10. The second metal layer 22a is a layer between the first metal layer 21b and the semiconductor layer 10, is bonded onto the first metal layer 21b by the second bonding surface JF2, and is disposed in contact with the semiconductor layer 10. Moreover, the second metal layer 22a is in ohmic contact or Schottky junction with the semiconductor layer 10.

The first metal layer 21b is a layer, different from the electrode layer 30b, among the plurality of layers, is formed so as to be buried in the second metal layer 22a, and is composed of, for example, TiC as a main component. The first metal layer 21b is formed so as to cover the electrode layer 30b and is covered with the second metal layer 22a. For example, the first bonding surface JF1 of the first metal layer 21b is bonded onto the electrode layer 30b so as to cover surfaces, other than the electrode connecting surface MF, of the electrode layer 30b.

Here, the first bonding surface JF1 includes a surface parallel to the main surface SF, on the outer side (the side far from the semiconductor layer 10), of the first metal layer 21b and a surface parallel to the thickness direction (Z-axis direction) which is in contact with the electrode layer 30b. Additionally, the second bonding surface JF2 includes a surface parallel to the main surface SF, on the inner side (side close to the semiconductor layer 10), of the first metal layer 21b and a surface parallel to the thickness direction (Z-axis direction) which is in contact with the second metal layer 22a.

Further, the first metal layer 21b is electrically connected to the semiconductor layer 10 via the second bonding surface JF2 and the second metal layer 22a.

The electrode layer 30b is one of the plurality of layers, has the electrode connecting surface MF to which the conductive connecting member 40 is connected, and is composed of, for example, Ag as a main component. The electrode layer 30b is formed such that the surfaces thereof excluding the electrode connecting surface MF are covered with the first metal layer 21b. In other words, the electrode layer 30b is buried in the first metal layer 21b. Additionally, in the electrode layer 30b, a surface opposing the electrode connecting surface MF (surface facing away from the electrode connecting surface MF) is formed inside the main surface SF of the semiconductor layer 10 on the side where the electrode layer 30b is disposed, in the thickness direction of the semiconductor layer 10. Further, the electrode layer 30b is disposed so that the electrode connecting surface MF is aligned with the main surface SF of the semiconductor layer 10 in the thickness direction.

As described above, the semiconductor device 1c according to the present embodiment includes the semiconductor layer 10, the electrode layer 30b, the first metal layer 21b, and the second metal layer 22a.

As a result, the semiconductor device 1c according to the present embodiment achieves the same effects as those of the second embodiment, and can increase an allowable current without lowering the bonding strength between the electrode layer 30b and the metal layer (the first metal layer 21b).

Further, in the present embodiment, in the electrode layer 30b, the surface opposing the electrode connecting surface MF is disposed inside the main surface SF of the semiconductor layer 10 on the side where the electrode layer 30b is disposed, in the thickness direction of the semiconductor layer 10.

Thus, since the electrode layer 30b is disposed so as to be covered with the semiconductor layer 10, the semiconductor device 1c according to the present embodiment can further suppress the corrosion of Ag of the electrode layer 30b, and further improve the corrosion resistance.

Moreover, in the semiconductor device 1c according to the present embodiment, the first metal layer 21b and the second metal layer 22a are disposed so as to cover the electrode layer 30b, and the electrode layer 30b, the first metal layer 21b, and the second metal layer 22a are buried in the semiconductor layer 10.

As a result, the semiconductor device 1c according to the present embodiment can further improve the bonding strength among the electrode layer 30b, the first metal layer 21b, and the second metal layer 22a. Therefore, it is possible to further reduce occurrence of manufacturing troubles such as peeling of the electrode layer 30b due to, for example, a load (stress, stress) applied when the connecting member 40 is connected to the electrode layer 30b.

Fifth Embodiment

Next, a semiconductor device 1d according to a fifth embodiment of the present invention will be described with reference to FIG. 5.

Figure 5:
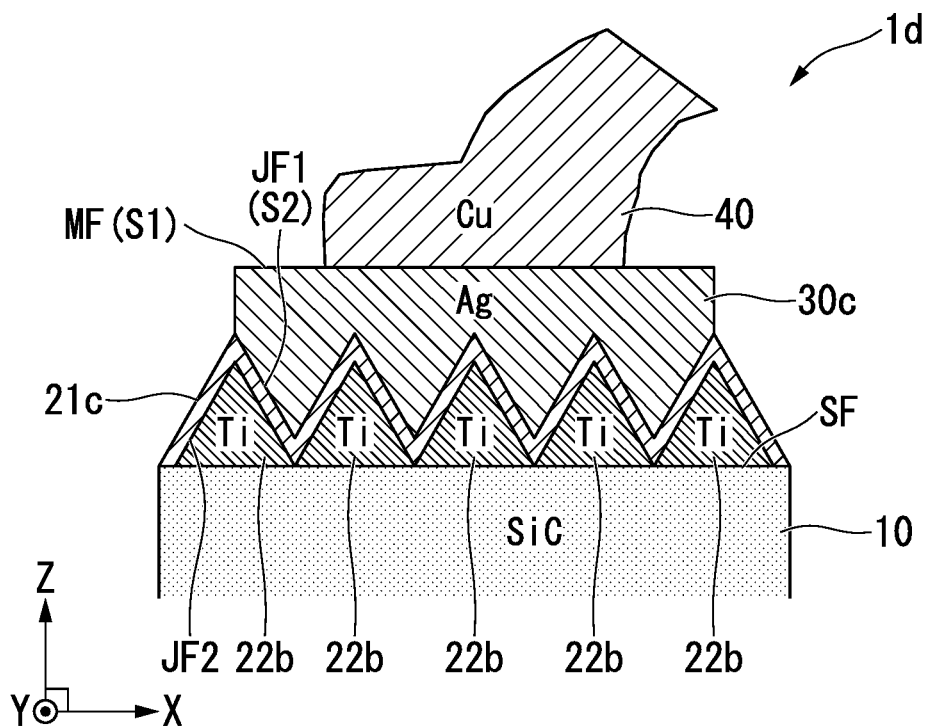
FIG. 5 is a sectional configuration diagram showing an example of a semiconductor device according to a fifth embodiment.

As shown in FIG. 5, the semiconductor device 1d according to the fifth embodiment includes the semiconductor layer 10, a first metal layer 21c, a second metal layer 22b, an electrode layer 30c, and the connecting member 40. Here, in FIG. 5, the same components as those in FIG. 1 are denoted by the same reference numerals, and description thereof is omitted.

The present embodiment differs from the first embodiment in that the shapes of the plurality of metal layers (the first metal layer 21c, the second metal layer 22b, and the electrode layer 30c) are different.

The second metal layer 22b is a metal layer formed on the main surface SF of the semiconductor layer 10 so as to have an uneven shape, and is composed of, for example, Ti as a main component. A surface of the second metal layer 22b, in contact with the main surface SF of the semiconductor layer 10, is a flat surface, while a surface thereof facing the first metal layer 21c side is an uneven surface.

Additionally, in FIG. 5, a case where the second metal layer 22b is formed in a mountain shape (triangular shape in cross section) is illustrated. A plurality of these mountain shapes are arranged on the semiconductor layer 10. The second metal layer 22b is a layer between the first metal layer 21c and the semiconductor layer 10, is bonded onto the first metal layer 21c by the second bonding surface JF2, and is disposed in contact with the semiconductor layer 10. Further, the second metal layer 22b is in ohmic contact or Schottky junction with the semiconductor layer 10.

Here, as shown in FIG. 5, the second metal layers 22b having the plurality of mountain shapes may be formed so that the individual mountain shapes are separated from one another, or may be formed such that, for example, portions of the second metal layer 22b, adjacent to the plurality of mountain shapes, are integrally connected with one another.

The first metal layer 21c is a metal layer formed along the shape of the second metal layer 22b, and is composed of, for example, TiC as a main component. The first metal layer 21c is disposed between the electrode layer 30c and the second metal layer 22b.

Here, the first bonding surface JF1 is a bonding surface between the electrode layer 30c and the first metal layer 21c, while the second bonding surface JF2 is a bonding surface between the first metal layer 21c and the second metal layer 22b. The first bonding surface JF1 and the second bonding surface JF2 are formed in such a shape as to follow (conform to) the uneven surface of the second metal layer 22b. Additionally, the first metal layer 21c is configured such that the bonding area (S2) of the first bonding surface JF1 is larger than the area (S1) of the electrode connecting surface MF.

The electrode layer 30c has the electrode connecting surface MF to which the conductive connecting member 40 is connected, and is composed of, for example, Ag as a main component. The electrode layer 30c is formed outside the first metal layer 21c, and the connecting member 40 is connected to the electrode connecting surface MF. Additionally, a surface, opposing the first bonding surface JF1, of the electrode layer 30c is formed so as to follow the uneven shape of the first bonding surface JF1.

As described above, the semiconductor device 1d according to the present embodiment includes the semiconductor layer 10, the electrode layer 30c, the first metal layer 21c, and the second metal layer 22b.

As a result, the semiconductor device 1d according to the present embodiment achieves the same effects as those of the first embodiment, and can increase an allowable current without lowering the bonding strength between the electrode layer 30c and the metal layer (the first metal layer 21c).

Additionally, in the present embodiment, in the first metal layer 21c, the bonding area (S2) of the first bonding surface JF1 is larger than the area (S1) of the electrode connecting surface MF.

Thus, in the semiconductor device 1d according to the present embodiment, since the area of the first bonding surface JF1 is larger (wider) than that of the first embodiment, the bonding strength between the electrode layer 30c and the first metal layer 21c can be further improved.

Sixth Embodiment

Next, a semiconductor device 1e according to a sixth embodiment of the present invention will be described with reference to FIG. 6.

Figure 6:
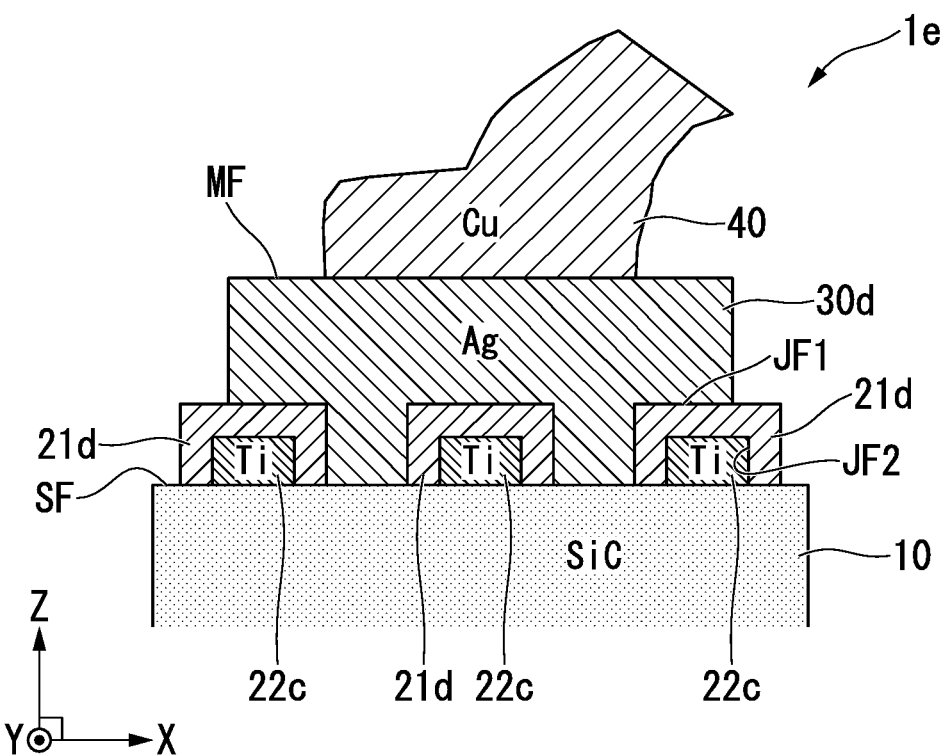
FIG. 6 is a sectional configuration diagram showing an example of a semiconductor device according to a sixth embodiment.

As shown in FIG. 6, the semiconductor device 1e according to the sixth embodiment includes the semiconductor layer 10, a first metal layer 21d, a second metal layer 22c, an electrode layer 30d, and the connecting member 40. Here, in FIG. 6, the same components as those in FIG. 1 are denoted by the same reference numerals, and description thereof is omitted.

The present embodiment differs from the first embodiment in that the shapes of the plurality of metal layers (the first metal layer 21d, the second metal layer 22c, and the electrode layer 30d) are different, and that the electrode layer 30d directly contacts the semiconductor layer 10.

The second metal layer 22c is a metal layer including a plurality of protruding portions formed on the main surface SF of the semiconductor layer 10, and is composed of, for example, Ti as a main component. The protruding portions are formed in a rectangular shape in cross-sectional view (rectangular shape in cross section). A plurality of protruding portions are provided and formed on the semiconductor layer 10 so as to be, for example, being separated from one another. The second metal layer 22c is covered with the first metal layer 21d and disposed in contact with the first metal layer 21d and the semiconductor layer 10. Additionally, the second metal layer 22c is in ohmic contact or Schottky junction with the semiconductor layer 10.

The first metal layer 21d is a metal layer formed to cover the second metal layer 22c along the shape of the second metal layer 22c, and is composed of, for example, TiC as a main component. Like the second metal layers 22c, the first metal layers 21d are formed so as to be, for example, separated from one another. The first metal layer 21d is disposed between the electrode layer 30d and the second metal layer 22c. Here, the first metal layer 21d is also in contact with the main surface SF of the semiconductor layer 10.

Here, the first bonding surface JF1 is a bonding surface between the electrode layer 30d and the first metal layer 21d, while the second bonding surface JF2 is a bonding surface between the first metal layer 21d and the second metal layer 22c. The first bonding surface JF1 and the second bonding surface JF2 are formed so as to follow the rectangular cross-sectional shape of the second metal layer 22c.

The electrode layer 30d has the electrode connecting surface MF to which the conductive connecting member 40 is connected, and is composed of, for example, Ag as a main component. The electrode layer 30d is formed in contact with the first metal layer 21d and the semiconductor layer 10, and the connecting member 40 is connected to the electrode connecting surface MF. Additionally, a surface, opposing the first bonding surface JF1, of the electrode layer 30d is formed so as to follow the first bonding surface JF1. Further, the electrode layer 30d is in contact with the main surface SF of the semiconductor layer 10.

As described above, the semiconductor device 1e according to the present embodiment includes the semiconductor layer 10, the electrode layer 30d, the first metal layer 21d, and the second metal layer 22c.

As a result, the semiconductor device 1e according to the present embodiment achieves the same effects as those of the first embodiment, and can increase an allowable current without lowering the bonding strength between the electrode layer 30d and the metal layer (the first metal layer 21d).

Seventh Embodiment

Next, a semiconductor device if according to a seventh embodiment of the present invention will be described with reference to FIG. 7.

Figure 7:
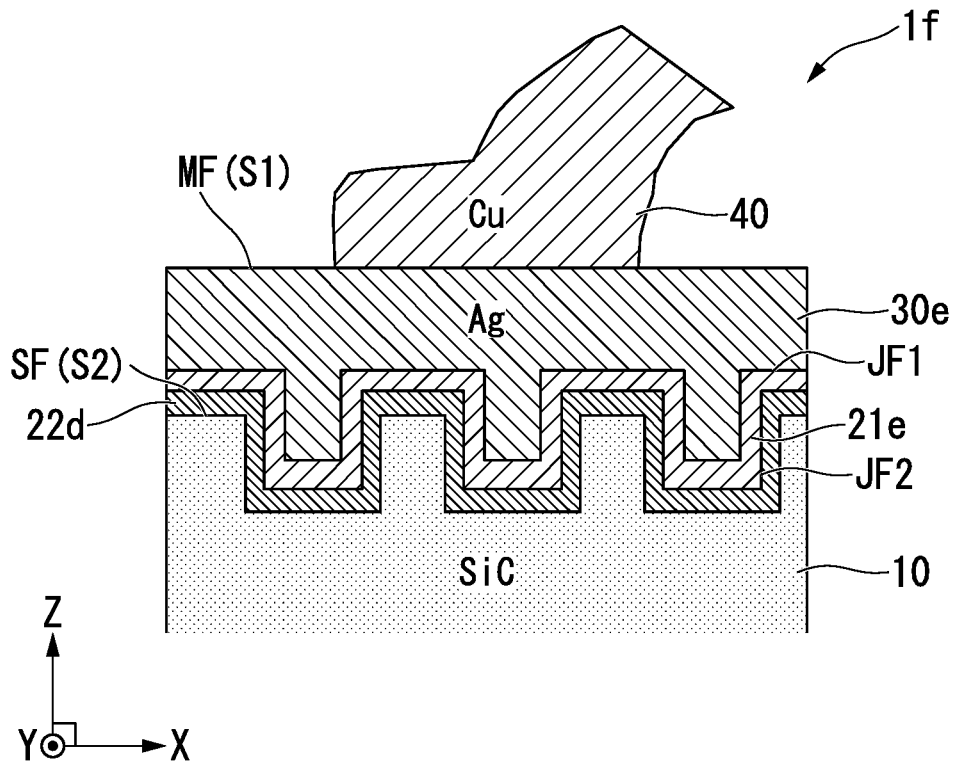
FIG. 7 is a sectional configuration diagram showing an example of a semiconductor device according to a seventh embodiment.

As shown in FIG. 7, the semiconductor device if according to the seventh embodiment includes the semiconductor layer 10, a first metal layer 21e, a second metal layer 22d, an electrode layer 30e, and the connecting member 40. Here, in FIG. 7, the same components as those in FIG. 1 are denoted by the same reference numerals, and description thereof is omitted.

The present embodiment differs from the first embodiment in that the shapes of the plurality of metal layers (the first metal layer 21e, the second metal layer 22d, and the electrode layer 30e) are different.

On the main surface SF side of the semiconductor layer 10, a plurality of trench shapes are formed. Here, the trench shape is, for example, a rectangular shape in cross-sectional view. Additionally, the trench shape of the semiconductor layer 10 as viewed from above the main surface SF may be dotted or linear. Further, the trench shape is not limited to the rectangular shape in cross-sectional view, and may be an arbitrary shape.

The second metal layer 22d is a metal layer formed along the plurality of trench shapes formed in the semiconductor layer 10, and is composed, for example, of Ti as a main component. Here, a surface of the second metal layer 22d, bonded onto the first metal layer 21e, also has a shape corresponding to the trench shape of the semiconductor layer 10.

Additionally, the second metal layer 22d is a layer between the first metal layer 21e and the semiconductor layer 10, is bonded onto the first metal layer 21e by the second bonding surface JF2, and is disposed in contact with the semiconductor layer 10. Further, the second metal layer 22d is in ohmic contact or Schottky junction with the semiconductor layer 10.

The first metal layer 21e is a metal layer formed along the shape of the second metal layer 22d, and is composed of, for example, TiC as a main component. The first metal layer 21e is disposed between the electrode layer 30e and the second metal layer 22d.

Here, the first bonding surface JF1 is a bonding surface between the electrode layer 30e and the first metal layer 21e, while the second bonding surface JF2 is a bonding surface between the first metal layer 21e and the second metal layer 22d. Additionally, the first metal layer 21e is configured such that the bonding area (S2) of the first bonding surface JF1 is larger than the area (S1) of the electrode connecting surface MF.

The electrode layer 30e has the electrode connecting surface MF to which the conductive connecting member 40 is connected, and is composed of, for example, Ag as a main component. The electrode layer 30e is formed outside the first metal layer 21e and in the thickness direction of the semiconductor layer 10. A part of the electrode layer 30e is formed so as to fill the trench shape in which the first metal layer 21e is formed and so that the first metal layer 21e is not exposed. The connecting member 40 is connected to the electrode connecting surface MF of the electrode layer 30e.

As described above, the semiconductor device if according to the present embodiment includes the semiconductor layer 10, the electrode layer 30e, the first metal layer 21e, and the second metal layer 22d.

As a result, the semiconductor device if according to the present embodiment achieves the same effects as those of the first embodiment, and can increase an allowable current without lowering the bonding strength between the electrode layer 30e and the metal layer (the first metal layer 21e).

Additionally, in the present embodiment, in the first metal layer 21e, the bonding area (S2) of the first bonding surface JF1 is larger than the area (S1) of the electrode connecting surface MF.

As a result, in the semiconductor device if according to the present embodiment, since the area of the first bonding surface JF1 is larger (wider) than that of the first embodiment, as in the fifth embodiment, it is possible to further improve the bonding strength between the electrode layer 30e and the first metal layer 21e.

Eighth Embodiment

Next, a semiconductor device 1g according to an eighth embodiment of the present invention will be described with reference to FIG. 8.

Figure 8:
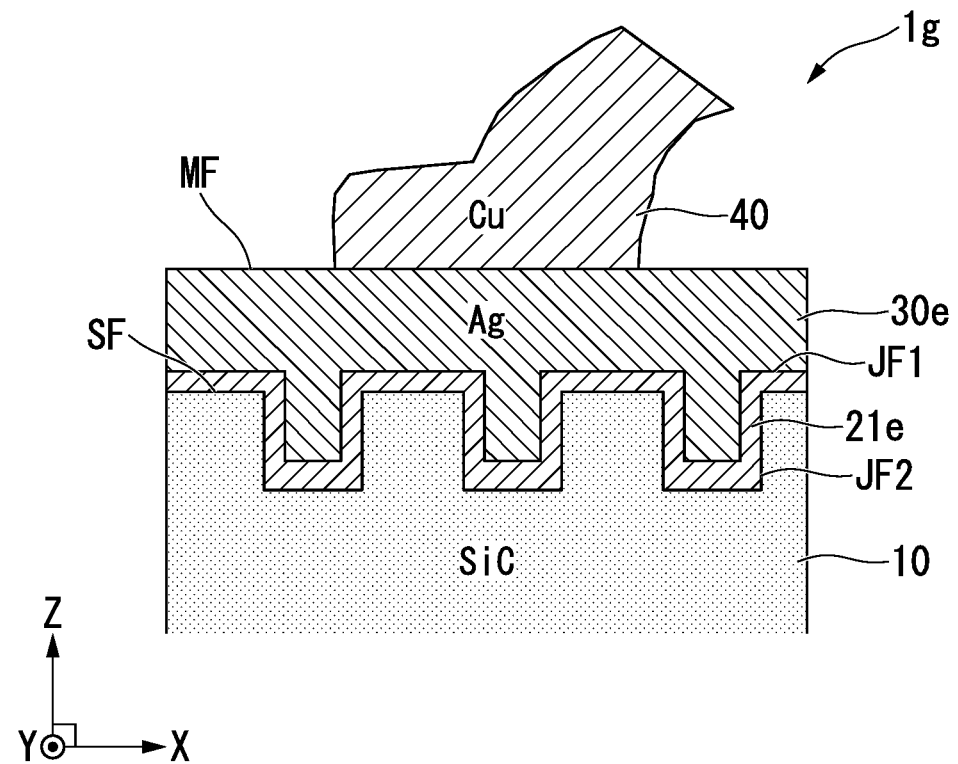
FIG. 8 is a sectional configuration diagram showing an example of a semiconductor device according to an eighth embodiment.

As shown in FIG. 8, the semiconductor device 1g according to the eighth embodiment includes the semiconductor layer 10, the first metal layer 21e, the electrode layer 30e, and the connecting member 40. Here, in FIG. 8, the same components as those in FIG. 7 are denoted by the same reference numerals, and description thereof is omitted.

The present embodiment differs from the seventh embodiment in that the semiconductor device 1g does not include the second metal layer 22d of Ti.

The first metal layer 21e is a metal layer formed along a plurality of trench shapes formed in the semiconductor layer 10, and is composed of, for example, TiC as a main component. The first metal layer 21e is a layer between the electrode layer 30e and the semiconductor layer 10, is bonded onto the electrode layer 30e by the first bonding surface JF1, and is disposed in contact with the semiconductor layer 10 by the second bonding surface JF. Additionally, the first metal layer 21e is in ohmic contact or Schottky junction with the semiconductor layer 10.

As described above, the semiconductor device 1g according to the present embodiment includes the semiconductor layer 10, the electrode layer 30e, and the first metal layer 21e.

As a result, the semiconductor device 1g according to the present embodiment achieves the same effects as those of the seventh embodiment, and can increase an allowable current without lowering the bonding strength between the electrode layer 30e and the metal layer (the first metal layer 21e).

Further, since there is no need to form the second metal layer 22d, the semiconductor device 1g according to the present invention can simplify the manufacturing process and the configuration of the metal layer, as compared with the seventh embodiment.

Ninth Embodiment

Next, a semiconductor device 1h according to a ninth embodiment of the present invention will be described with reference to FIG. 9.

Figure 9:
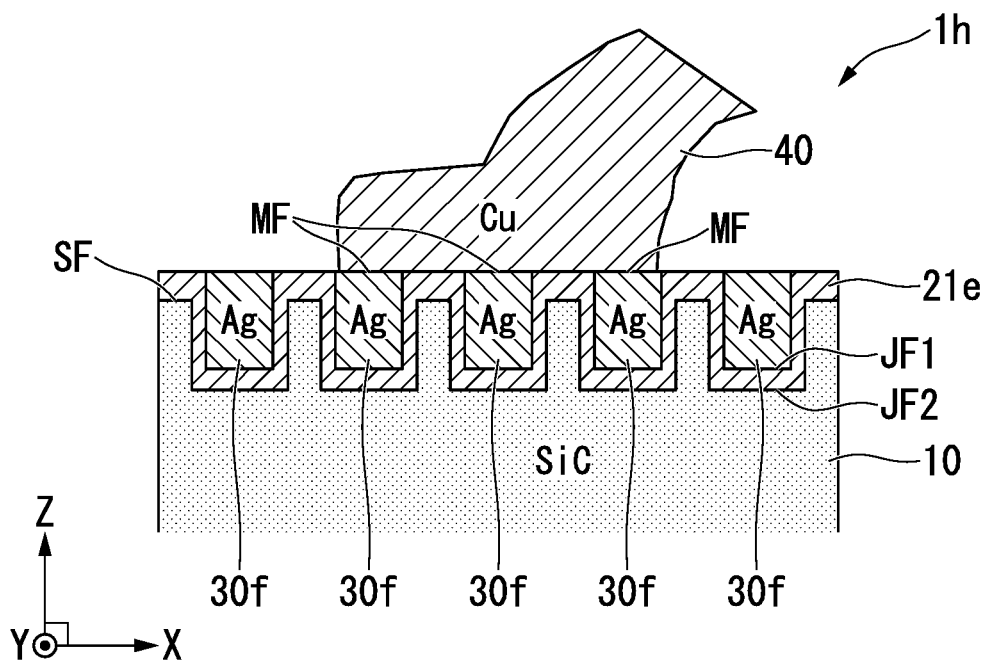
FIG. 9 is a sectional configuration diagram showing an example of a semiconductor device according to a ninth embodiment.

As shown in FIG. 9, the semiconductor device 1h according to the ninth embodiment includes the semiconductor layer 10, the first metal layer 21e, an electrode layer 30f, and the connecting member 40. Here, in FIG. 9, the same components as those in FIG. 8 are denoted by the same reference numerals, and description thereof is omitted.

The present embodiment differs from the eighth embodiment in that the shape of the electrode layer 30f is different.

The electrode layer 30f has the electrode connecting surface MF to which the conductive connecting member 40 is connected, and is composed of, for example, Ag as a main component. The electrode layer 30f is formed so as to fill a plurality of trench shapes formed by the semiconductor layer 10 and the first metal layer 21e and so that a flat surface exposed to the outside of the first metal layer 21e is aligned with the electrode connecting surface MF. Additionally, the connecting member 40 is connected to the electrode connecting surface MF of the electrode layer 30f.

Here, in the present embodiment, the connecting member 40 is connected to the electrode connecting surface MF of the plurality of electrode layers 30f and the first metal layer 21e. In other words, the single connecting member 40 is connected to the electrode connecting surface MF of the plurality of electrode layers 30f.

As described above, the semiconductor device 1h according to the present embodiment includes the semiconductor layer 10, the electrode layer 30f, and the first metal layer 21e.

As a result, the semiconductor device 1h according to the present embodiment achieves the same effects as those of the eighth embodiment, and can increase an allowable current without lowering the bonding strength between the electrode layer 30f and the metal layer (the first metal layer 21e).

Tenth Embodiment

Next, a semiconductor device 1i according to a tenth embodiment of the present invention will be described with reference to FIG. 10.

Figure 10:
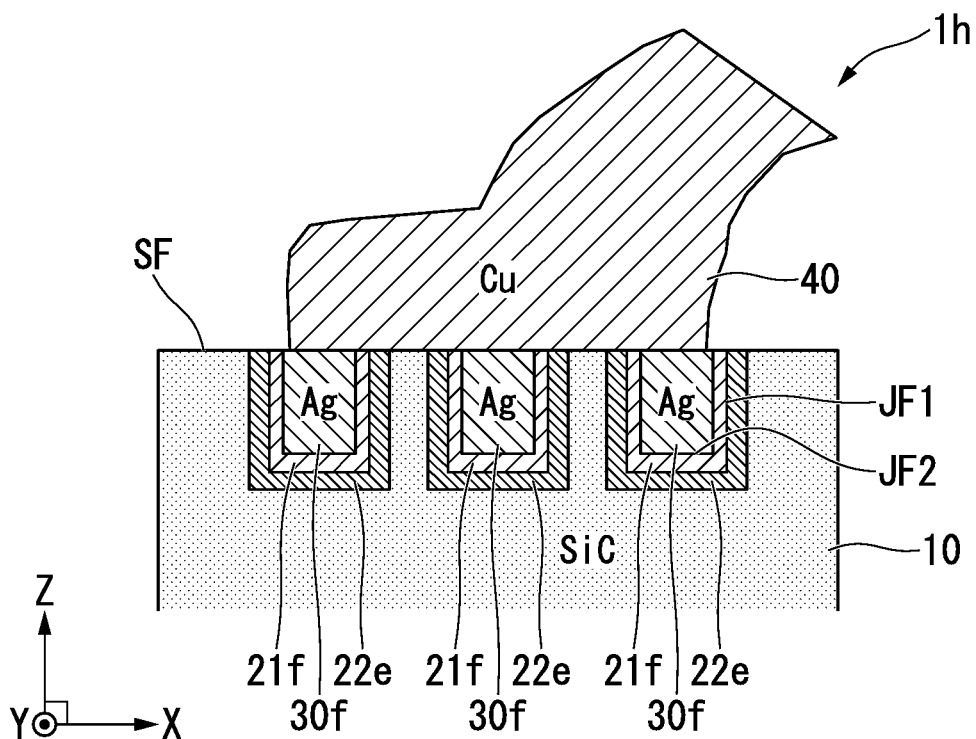
FIG. 10 is a sectional configuration diagram showing an example of a semiconductor device according to a tenth embodiment.

As shown in FIG. 10, the semiconductor device 1i according to the tenth embodiment includes the semiconductor layer 10, a first metal layer 21f, a second metal layer 22e, the electrode layer 30f, and the connecting member 40. Here, in FIG. 10, the same components as those in FIGS. 4 and 9 are denoted by the same reference numerals, and description thereof is omitted.

In the present embodiment, a modified example provided with a plurality of structures each including the electrode layer 30f, similar to that of the fourth embodiment, which is buried in the semiconductor layer 10, will be described.

The first metal layer 21f, the second metal layer 22e, and the electrode layer 30f according to the present embodiment have the same configurations as those of the first metal layer 21b, the second metal layer 22a, and the electrode layer 30b according to the fourth embodiment, and explanation will be omitted here.

The semiconductor device 1i includes plural sets of metal layers of the first metal layer 21f, the second metal layer 22e, and the electrode layer 30f, and each set is buried in the semiconductor layer 10 at a predetermined interval.

The connecting member 40 is connected to the electrode connecting surface MF over the plurality of electrode layers 30f. In other words, the single connecting member 40 is connected to the electrode connecting surface MF of the plurality of electrode layers 30f.

As described above, the semiconductor device 1i according to the present embodiment includes the plural sets of metal layers of the semiconductor layer 10, the electrode layer 30f, the first metal layer 21f, and the second metal layer 22e.

As a result, the semiconductor device 1i according to the present embodiment achieves the same effects as those of the fourth embodiment, and can increase an allowable current without lowering the bonding strength between the electrode layer 30f and the metal layer (the first metal layer 21f).

Eleventh Embodiment

Next, a semiconductor device 1j according to an eleventh embodiment of the present invention will be described with reference to FIGS. 11 and 12.

Figure 11:
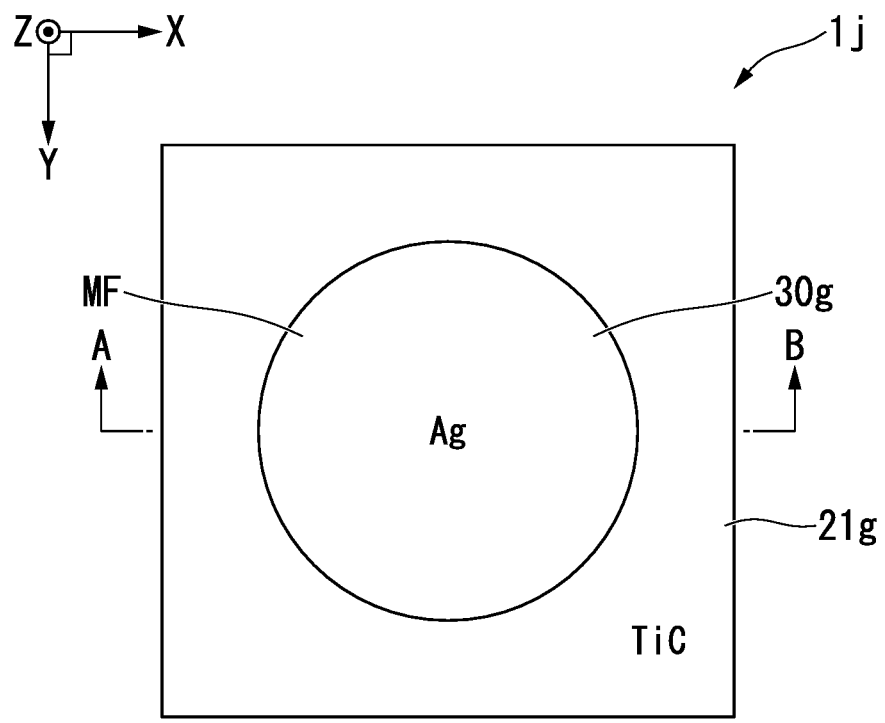
FIG. 11 is a main-surface-side plan configuration diagram showing an example of a semiconductor device according to an eleventh embodiment.
Figure 12:
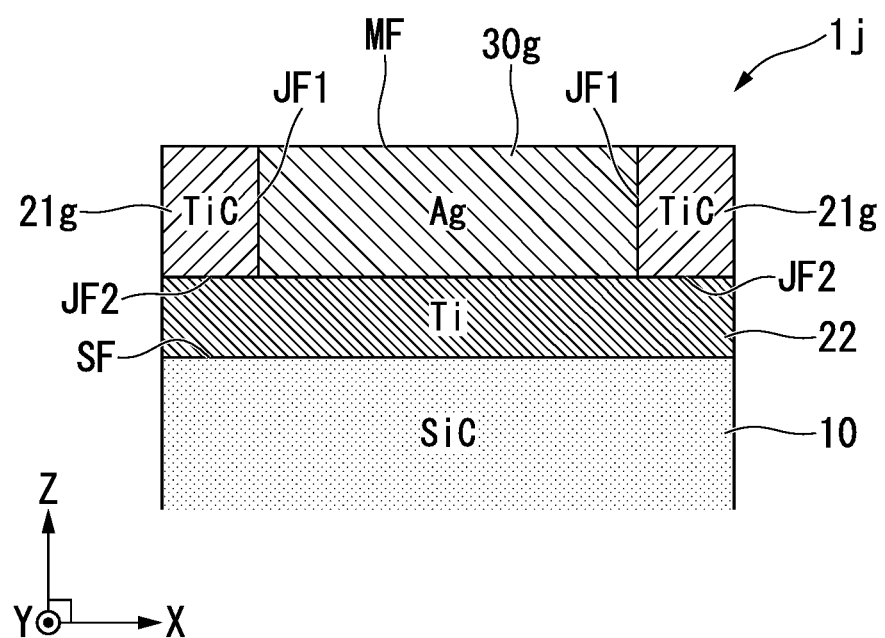
FIG. 12 is a sectional configuration diagram showing an example of a semiconductor device according to the eleventh embodiment.

Here, the semiconductor device 1j shown in FIG. 12 shows a cross section along a line AB of the semiconductor device 1j shown in FIG. 11. Additionally, in FIGS. 11 and 12, to simplify the description, the description of the connecting member 40 is omitted.

Further, in FIGS. 11 and 12, the same components as those in FIG. 1 are denoted by the same reference numerals, and the description thereof will be omitted.

The semiconductor device 1j according to the eleventh embodiment includes a columnar electrode layer 30g and a first metal layer 21g disposed so as to cover a side surface (circumferential surface) of the electrode layer 30g, on the main surface SF side of the semiconductor layer 10 including the electrode layer 30g.

Additionally, the semiconductor device 1j includes the semiconductor layer 10, the first metal layer 21g, the second metal layer 22, and the electrode layer 30g.

The electrode layer 30g has the electrode connecting surface MF to which the conductive connecting member 40 is connected, and is composed of, for example, Ag as a main component. The electrode layer 30g is formed in a circular shape on a plane (XY-plane) parallel to the main surface SF, and is surrounded by the first metal layer 21g. Additionally, the connecting member 40 is connected to the electrode connecting surface MF of the electrode layer 30g.

The first metal layer 21g is disposed around the electrode layer 30g on the XY-plane, and is composed, for example, of TiC as a main component. Additionally, the first metal layer 21g has a first bonding surface JF1 bonded onto the peripheral surface (side surface) of the electrode layer 30g so that the electrode connecting surface MF is exposed to the outside and a second bonding surface JF2 bonded onto the second metal layer 22. The second bonding surface JF2 of the first metal layer 21g is electrically connected to the semiconductor layer 10 via the second metal layer 22.

Here, the first bonding surface JF1 is a bonding surface between the electrode layer 30g and the first metal layer 21g, for example, a bonding surface formed so as to be perpendicular to the main surface SF and the electrode connecting surface MF of the semiconductor layer 10. In other words, the first bonding surface JF1 is a bonding surface parallel to the thickness direction (Z-axis direction) of the semiconductor device 1j. Additionally, the second bonding surface JF2 is a bonding surface between the first metal layer 21g and the second metal layer 22, for example, is a bonding surface formed so as to be parallel to the main surface SF and the electrode connecting surface MF of the semiconductor layer 10.

The second metal layer 22 is disposed between the semiconductor layer 10 and the first metal layer 21g and electrode layer 30g. Additionally, the second metal layer 22 is disposed in contact with surfaces of the electrode layer 30g and the first metal layer 21g which face away from the main surface SF of the semiconductor layer 10.

As described above, the semiconductor device 1j according to the present embodiment includes the semiconductor layer 10, the electrode layer 30g, the first metal layer 21g, and the second metal layer 22.

As a result, the semiconductor device 1j according to the present embodiment achieves the same effects as those of the first embodiment, and can increase an allowable current without lowering the bonding strength between the electrode layer 30g and the metal layer (the first metal layer 21g and the second metal layer 22).

Twelfth Embodiment

Next, a semiconductor device 1k according to a twelfth embodiment of the present invention will be described with reference to FIGS. 13 and 14.

Figure 13:
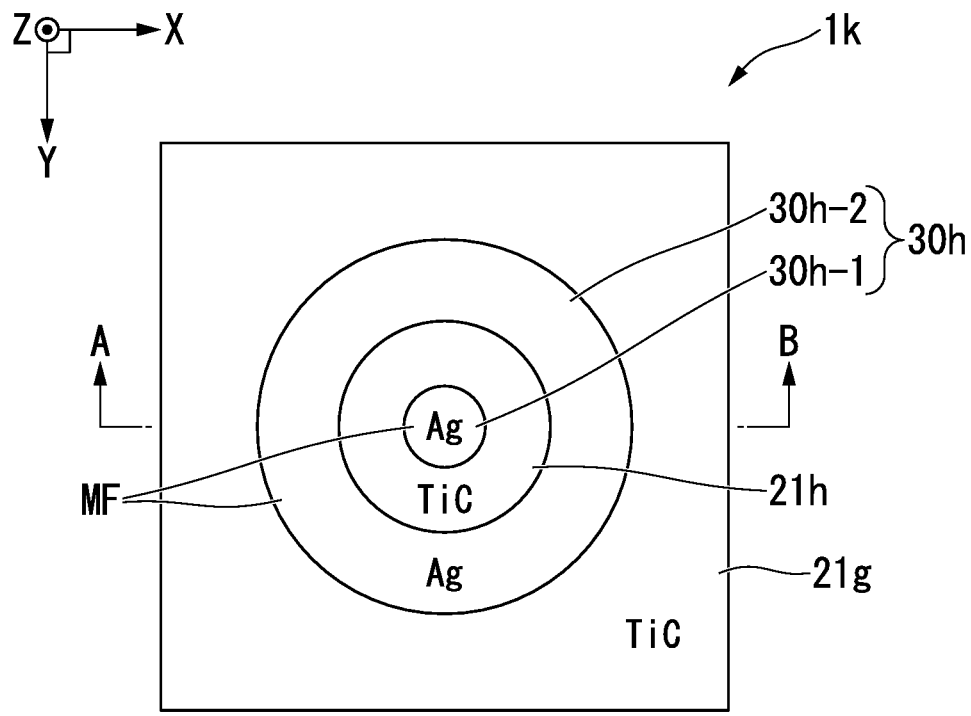
FIG. 13 is a main-surface-side plan configuration diagram showing an example of a semiconductor device according to a twelfth embodiment.

As shown in FIG. 13, the semiconductor device 1k according to the twelfth embodiment includes: an electrode layer 30h including a columnar electrode layer 30h-1 and a columnar electrode layer 30h-2 disposed concentric to the electrode layer 30h-1; and a first metal layer (21g, 21h) disposed so as to cover the electrode layer 30h, on the main surface SF side of the semiconductor layer 10 including the electrode layer 30h.

Figure 14:
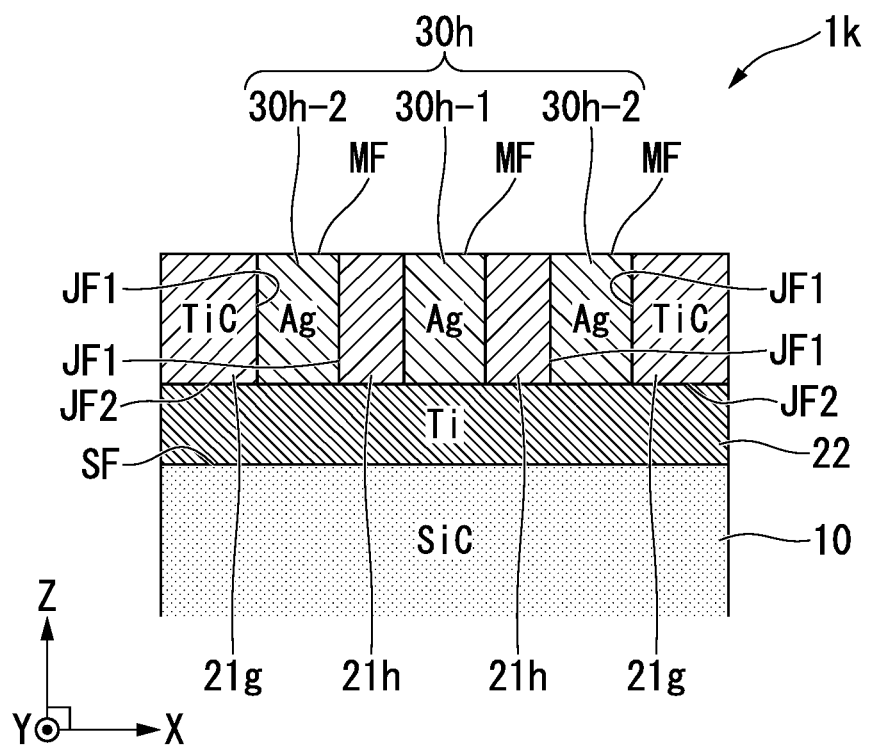
FIG. 14 is a sectional configuration diagram showing an example of a semiconductor device according to the twelfth embodiment.

Here, the semiconductor device 1k shown in FIG. 14 shows a cross section along a line AB of the semiconductor device 1k shown in FIG. 13. Additionally, in FIGS. 13 and 14, to simplify the description, the description of the connecting member 40 is omitted.

Further, in FIGS. 13 and 14, the same components as those in FIGS. 11 and 12 are denoted by the same reference numerals, and description thereof is omitted.

The semiconductor device 1k according to the present embodiment is a modified example where the electrode layer 30h is divided into the electrode layer 30h-1 and the electrode layer 30h-2, and the first metal layer 21h is added to the above-described twelfth embodiment.

Moreover, the semiconductor device 1k includes the semiconductor layer 10, the first metal layer (21g, 21h), the second metal layer 22, and the electrode layer 30h.

The first metal layer 21h is a columnar metal layer disposed between an outer periphery of the electrode layer 30h-1 and an inner periphery of the electrode layer 30h-2 on a plane (XY-plane) parallel to the main plane SF, and is composed of, for example, TiC as a main component. Additionally, the first metal layer 21g and the first metal layer 21h have a first bonding surface JF1 bonded onto the electrode layer 30h so that the electrode connecting surface MF is exposed to the outside and a second bonding surface JF2 bonded onto the second metal layer 22.

Here, the first bonding surface JF1 is a bonding surface between the electrode layer 30h (30h-1, 30h-2) and the first metal layer (21g, 21h), for example, a bonding surface formed so as to be perpendicular to the main surface SF and the electrode connecting surface MF of the semiconductor layer 10. In other words, the first bonding surface JF1 is a bonding surface parallel to the thickness direction (Z-axis direction) of the semiconductor device 1k. Additionally, the second bonding surface JF2 is a bonding surface between the first metal layer (21g, 21h) and the second metal layer 22, for example, a bonding surface formed parallel to the main surface SF and the electrode connecting surface MF of the semiconductor layer 10.

The electrode layer 30h includes the above-described columnar electrode layer 30h-1 and the columnar electrode layer 30h-2. The columnar electrode layer 30h-2 is disposed outside in the radial direction of, and separated from, the electrode layer 30h-1. Additionally, the electrode layer 30h (the electrode layers 30h-1, 30h-2) is disposed such that the periphery thereof is surrounded by the first metal layers (21g, 21h). Further, the connecting member 40 is connected to the electrode connecting surface MF of the electrode layer 30h (the electrode layers 30h-1 and 30h-2).

As described above, the semiconductor device 1k according to the present embodiment includes the semiconductor layer 10, the electrode layer 30h (the electrode layers 30h-1, 30h-2), the first metal layer (21g, 21h), and the second metal layer 22.

Thus, the semiconductor device 1k according to the present embodiment achieves the same effects as those of the eleventh embodiment, and can increase an allowable current without lowering the bonding strength between the electrode layer 30h (the electrode layers 30h-1 and 30h-2) and the metal layer (the first metal layer (21g, 21h) and the second metal layer 22).

Here, the present invention is not limited to the above embodiments, but can be modified within a scope, not departing from the gist, of the present invention.

For example, although each of the above embodiments has been described as independently implemented, a part or the whole of each embodiment may be combined and implemented.

Additionally, each of the above-described embodiments has been described with the example where the connecting member 40 connected to the electrode layer 30 (30a to 30h) is Cu (copper), the present invention is not limited thereto, and the connecting member 40 may be gold (Au), aluminum (Al), or another metal.

DESCRIPTION OF REFERENCE NUMERALS 1, 1a to 1k semiconductor device
10 semiconductor layer
21, 21a to 21h first metal layer
22, 22a to 22e second metal layer
30, 30a to 30h, 30h-1, 30h-2 electrode layer
40 connecting member
MF electrode connecting surface
SF main surface
JF1 first bonding surface
JF2 second bonding surface

The invention claimed is:

1. A semiconductor device comprising:
    a semiconductor layer including silicon carbide and having a main surface;
    an electrode layer over the main surface of the semiconductor layer, wherein
        the electrode layer has a first bottom surface facing the semiconductor layer, a top surface opposing the bottom surface, and a side surface, and
        the electrode layer being a single layer mainly including silver;
    a conductive wire in direct physical contact with the top surface of the electrode layer; and
    a first metal layer mainly including titanium carbide, wherein
        the first metal layer is configured to prevent the silver included in the electrode layer from diffusing into the semiconductor layer, and
        the first metal layer covers, and is in direct physical contact with, the bottom and side surfaces of the electrode layer, and
        the first metal layer is electrically connected to the main surface of the semiconductor layer.

2. The semiconductor device according to claim 1, further comprising:
    a second metal layer between the first metal layer and the semiconductor layer, wherein
    the second metal layer covers, and is in direct physical contact with, bottom and side surfaces of the first metal layer, and
    the second metal layer is in direct physical contact with the main surface of the semiconductor layer, and
    the second metal layer mainly includes titanium.

3. The semiconductor device according to claim 1, wherein
    a first contact area between the electrode layer and the first metal layer is larger than a second contact area between the electrode layer and the conductive wire.

4. The semiconductor device according to claim 1, wherein,
    the main surface of the semiconductor layer has a recessed portion, and
    the electrode layer and the first metal layer are inside the recessed portion of the semiconductor layer.

5. The semiconductor device according to claim 1, wherein
    the conductive wire mainly includes copper.

6. The semiconductor device according to claim 1, wherein neither the electrode layer nor the first metal layer includes aluminum.

7. The semiconductor device according to claim 6, wherein the conductive wire includes aluminum.

8. The semiconductor device according to claim 2, wherein
    the main surface (SF) of the semiconductor layer has a recessed portion,
    the electrode layer, the first metal layer, and the second metal layer are inside the recessed portion of the semiconductor layer, and
    the semiconductor layer covers, and is in direct physical contact with, bottom and side surfaces of the second metal layer.

* * * * *